(12) United States Patent
Chan et al.

(10) Patent No.: US 7,841,741 B2
(45) Date of Patent: Nov. 30, 2010

(54) LED LIGHTING ASSEMBLY AND LAMP UTILIZING SAME

(75) Inventors: Benson Chan, Vestal, NY (US); John E. Kozol, Binghamton, NY (US); John M. Lauffer, Waverly, NY (US); How T. Lin, Vestal, NY (US)

(73) Assignee: Endicott Interconnect Technologies, Inc., Endicott, NY (US)

( * ) Notice: Subject to any disclaimer, the term of this patent is extended or adjusted under 35 U.S.C. 154(b) by 376 days.

(21) Appl. No.: 11/730,404

(22) Filed: Apr. 2, 2007

(65) Prior Publication Data

US 2008/0238323 A1 Oct. 2, 2008

(51) Int. Cl.
*F21S 4/00* (2006.01)

(52) U.S. Cl. .................. 362/249.04; 362/249.02; 362/249.06; 362/249.08; 362/285; 362/227

(58) Field of Classification Search ............ 362/218, 362/224, 225, 227, 249.02–249.13, 285, 362/287, 97.2, 294, 373
See application file for complete search history.

(56) References Cited

U.S. PATENT DOCUMENTS

| | | | |
|---|---|---|---|
| 4,075,471 A | 2/1978 | Jones | |
| 4,253,135 A | 2/1981 | Black | |
| 4,270,162 A | 5/1981 | Cherouge | |
| 4,296,460 A | 10/1981 | Minoprio et al. | |
| 4,329,737 A | 5/1982 | Triller et al. | |
| 4,555,749 A | 11/1985 | Rifkin et al. | |
| 4,559,589 A | 12/1985 | Sassmannshausen | |
| 4,580,196 A | 4/1986 | Task | |
| 4,630,183 A | 12/1986 | Fujita | |
| 4,929,866 A | 5/1990 | Murata et al. | |
| 4,967,330 A | 10/1990 | Bell et al. | |
| 5,001,038 A * | 3/1991 | Dorinski et al. | 430/311 |
| 5,121,311 A | 6/1992 | Cheselske | |
| 5,221,140 A | 6/1993 | Oshino | |
| 5,313,729 A | 5/1994 | Sakai et al. | |
| 5,528,474 A | 6/1996 | Roney et al. | |
| 5,685,637 A * | 11/1997 | Chapman et al. | 362/263 |
| 5,808,718 A | 9/1998 | Aikoh et al. | |
| 5,865,529 A | 2/1999 | Yan | |
| 5,879,076 A | 3/1999 | Cross | |
| 5,897,195 A | 4/1999 | Choate | |
| 5,931,570 A | 8/1999 | Yamuro | |
| 5,947,588 A | 9/1999 | Huang | |
| 6,161,910 A | 12/2000 | Reisenauer et al. | |
| 6,328,456 B1 | 12/2001 | Mize | |
| 6,507,290 B1 | 1/2003 | Lodhie et al. | |
| 6,527,419 B1 | 3/2003 | Galli | |
| 6,568,834 B1 | 5/2003 | Scianna | |

(Continued)

*Primary Examiner*—Sandra L O Shea
*Assistant Examiner*—Danielle Allen
(74) *Attorney, Agent, or Firm*—Mark Levy; Lawrence R. Fraley; Hinman, Howard & Kattell (57) ABSTRACT

An LED lighting assembly including a plurality of individual LEDs mounted on a common, bendable heat sinking member designed to remove heat from the LEDs during operation and also to be formed (bent) to provide the desired light direction and intensity. Several such assemblies may be used within an LED lamp, as also provided herein. The lamp is ideal for use within medical and dental environments to assure optimal light onto a patient located at a specified distance from the lamp.

20 Claims, 5 Drawing Sheets

U.S. PATENT DOCUMENTS

| | | |
|---|---|---|
| 6,657,382 B2 | 12/2003 | Nagai et al. |
| 6,659,632 B2 | 12/2003 | Chen |
| 6,709,132 B2 | 3/2004 | Ishibashi |
| 6,793,374 B2 | 9/2004 | Begemann |
| 6,827,467 B2 | 12/2004 | Tenmyo |
| 6,851,834 B2 | 2/2005 | Leysath |
| 6,948,829 B2 | 9/2005 | Verdes et al. |
| 6,988,819 B2 | 1/2006 | Siktberg et al. |
| 6,994,455 B2 | 2/2006 | Okabe et al. |
| 7,040,779 B2 | 5/2006 | Lamke et al. |
| 7,052,161 B2 | 5/2006 | Lichtenstein et al. |
| 7,055,991 B2 | 6/2006 | Lin |
| 7,066,626 B2 | 6/2006 | Omata |
| 7,070,304 B2 | 7/2006 | Imai |
| 7,086,767 B2 | 8/2006 | Sidwell et al. |
| 7,128,444 B2 | 10/2006 | Isokawa et al. |
| 7,303,315 B2 * | 12/2007 | Ouderkirk et al. ............ 362/294 |
| 2003/0031015 A1 * | 2/2003 | Ishibashi .................... 362/249 |
| 2005/0174769 A1 * | 8/2005 | Yong et al. .................. 362/235 |
| 2005/0207152 A1 * | 9/2005 | Maxik ........................ 362/231 |
| 2006/0126328 A1 * | 6/2006 | Coushaine .................. 362/247 |

\* cited by examiner

LED LIGHTING ASSEMBLY AND LAMP UTILIZING SAME

TECHNICAL FIELD

The present invention relates broadly to light transmission media and to lighting assemblies and lamps for providing such light transmission. More particularly, this invention relates to improvements in such lighting assemblies and lamps which incorporate light emitting diodes as light sources. Even more particularly, the invention relates to such assemblies and lamps which may be utilized in a highly demanding environment such as the medical field, e.g., for use in surgery or dentistry.

BACKGROUND OF THE INVENTION

LEDs (light emitting diodes) have been used for various lighting purposes for many years, including, for example, as indicator lights and in arrays to form information displays. An LED is essentially a PN junction semiconductor diode that emits light when a current is applied thereto. The LED is a solid state device which operates at a low current and, as a single unit, produces negligible heat. It is typically encapsulated in a resin material which protects the device, making it durable and long-lasting. The use of conventional semiconductor light emitting diodes solves the problems of entrapped heat, lamp longevity, frequent lamp replacement and higher current operation. These structures thus possess the advantages over standard incandescent, fluorescent and HID (high intensity discharge) lamps by operating at relatively low voltages (e.g., in some cases as low as approximately three volts) and being relatively more energy efficient (e.g., generating approximately twenty-five lumens of light per watt). As is known, incandescent lamps are widely used in various existing lighting structures such as exit lights, flashing lights, hand-held signal lights (such as those used by traffic police), and display lights (such as those used in instrument panels), while fluorescent lamps are used in such lighting fixtures as office lighting, workshop lighting, and household lamps. HID lamps are used in a variety of environments, both indoors and outdoors, as well as in some automobile headlight systems.

Fluorescent, HID and incandescent lamps (especially incandescent lamps) are susceptible to vibration, which may cause a failure or a shortening of the useful life of the bulb. The mean failure time for a typical incandescent lamp product is less than about 2000 hours. In comparison, a fluorescent lamp will need replacement approximately every 15,000 hours and an HID lamp will need replacement about every 20,000 hours. Ballasts are also needed with respect to fluorescent lamps, which also typically need replacement within a fixed period, e.g., every five years. Such replacements are costly and disruptive to persons exposed to such lighting sources, particularly in a workplace environment such as a surgical or dental facility. In sharp contrast, LED lamps typically have a mean failure time of approximately 100,000 hours. Understandably, the use of LED as light sources thus presents many advantages over incandescent, fluorescent and HID lamps. This is especially true in the medical environment. LEDs can provide light in the desired 5000-5500K color temperature without the generation of excessive amounts of heat per LED. This is particularly true for the large majority of LEDs which do not produce light in the IR spectrum. For those LEDs which do produce light in the IR spectrum, heat generation is of course more of a concern. As known, heat is undesirable in such an environment. Although a typical single LED (one which does not produce light in the IR spectrum) produces relatively little heat, when utilized in combination with several others (especially when in close proximity thereto), an undesirable amount of heat may be generated when several such devices are used in close relationship to medical staff and/or a patient during relatively complex procedures as surgery or dental work. Excessive heat, for example, may rapidly dry exposed tissues of a surgical patient, which is of course undesirable. As understood from the teachings herein, the present invention is able to provide the many advantages of using multiple LEDs while assuring effective heat escape so as to assure excessive, undesirable heat does not affect nearby medical staff, patients and others who may be in close proximity to the invention.

As is also known, light produced from a single LED source is relatively concentrated, meaning that it appears to emanate from a small point source. A potential concern with such a characteristic is that metering units designed to measure the lamp's output may report that the lamp fails to meet required specifications. This is because such measurements are taken not only from the lamp's optical axis but over a broader range, e.g., plus or minus ten degrees from the lamp's axis. To accommodate for this, some lamps currently on the market include an array of several LEDs positioned on a suitable base so as to provide a much larger, but less concentrated output. As indicated from the foregoing, the present invention is able to successfully utilize several LEDs, and, as taught herein, does so while assuring optimal output in the intended environment and, significantly, while providing a substantially concentrated light output as is considered essential in medical environments such as mentioned above. As further indicated from the above, such features are provided from a multiple LED assembly and lamp using same in which heat is effectively allowed to escape and not adversely affect the lamp operators and others nearby. Such a product is considered to represent a significant advancement in the art.

The following U.S. Patents describe and illustrate various types of lighting products, most of these patents describing lighting assemblies utilizing one or more LED's as the light source. This listing is not an admission that any of said patents are prior art to the present invention.

In U.S. Pat. No. 7,128,444 there is described a light emitting diode lamp which includes a lead terminal formed with a cup having a conical inner circumferential surface serving as a light reflective surface, an LED chip bonded to a bottom surface of the cup with a die bonding material, and a molded portion made of a transparent synthetic resin for packaging the cup of the lead terminal.

In U.S. Pat. No. 7,086,767, there is described a solid-state (e.g., LED) light source compatible with existing sockets normally reserved for filamented lamps. The lamp may be formed with a hollow base formed to mechanically and electrically adapt to a socket. A circuit board substantially surrounds the base's metal core. A glass dome covers the subassembly after it is inserted into the hollow base and is sealed thereto.

In U.S. Pat. No. 7,070,304, there is described an LED which includes a substrate, a semi-spherical concave surface part formed in the substrate, and a transparent stage disposed in the semi-spherical concave surface part in the substrate. An LED chip is mounted on the horizontal upper surface of the transparent stage, a reflective member forms a truncated cone-shaped concave surface part disposed to be joined to an end of the semi-spherical concave surface part and attached on the substrate. A sealing body is disposed in the joined concave surface parts to cover the LED chip. The transparent stage includes a lower surface having a convex surface corresponding to a concave surface of the semi-spherical concave surface part and an upper surface formed in a horizontal surface.

In U.S. Pat. No. 7,066,626, there is described an LED lamp including a circuit substrate on which an electrode pattern is formed, a reflecting frame including a tapered concave portion having an inner peripheral surface broadening toward an upper end of the reflecting frame, a light emitting unit disposed on a central portion of the concave portion and including a plurality of LEDs, an air layer disposed above the light emitting unit, and a lens body provided through the air layer above the reflecting frame.

In U.S. Pat. No. 7,055,991, there is described a low-power, high-intensity lighting apparatus which includes a lamp base, a lamp housing, and a lamp unit. The lamp base includes a parabolic reflector. The lamp housing is mounted on the lamp base, and includes a surrounding wall and an optical condenser. The surrounding wall has a first open end, and a second open end opposite the first open end. The optical condenser is mounted on the lamp housing at the second open end. The lamp unit is mounted on the lamp base, extends into the lamp housing through the first open end of the surrounding wall, and generates light that propagates toward the parabolic reflector and that is reflected by the parabolic reflector toward the optical condenser. A plurality of LEDs may be used as the light source.

In U.S. Pat. No. 7,052,161, there is described an illuminative device essentially comprising a light source and a diffusing cover which is made of colored plastic. The light source consists of one or several light-emitting diodes (LEDs) emitting a colored and substantially monochromatic light. The diffusing cover assigned thereto has a transmission (DIN 5036) of at least 35% and a reflection (DIN 5036) of at least 15%, with the wavelength of the light-emitting diode operating at relative maximum energy.

In U.S. Pat. No. 7,040,779, there is described a lamp structure which the authors describe as being generally unbreakable. The lamp preferably is provided with a plurality of LEDs arranged with rows and columns on a circuit card or board and projecting upwardly in the same direction therefrom. The lamp is constructed by encapsulating the board and LED arrangement in a moldable lens material.

In U.S. Pat. No. 6,994,455, there is described a plurality of LED lamp modules each of which includes a base, an LED drive circuitry mounted on the base, and a cover coupled with the base to cover the LED drive circuitry. The LED lamp modules are stacked one on another while a single flat cable is extended through the LED lamp modules so as to have at least one first portion disposed outside the LED lamp modules and a plurality of second portions disposed inside the LED lamp modules to be electrically connected to the LED drive circuitry in each of the LED lamp modules.

In U.S. Pat. No. 6,988,819, there is described a lamp assembly (e.g., automobile lamp) with an integrated LED support frame. An electrically conductive lead frame is encapsulated in between the interior and exterior surfaces of a housing. Surface mounted LED light sources and associated drive components are attached to the lead frame, and thus to the housing. A positive terminal and a negative terminal are formed from the lead frame on the inside to the outside of the housing, so that electricity may be transmitted from an external source to the LED light sources on the inside of the housing. The LED light sources are energized by the conductive lead frame formed into or onto the housing, thus eliminating the need for a separate printed circuit board with a conductive lead frame.

In U.S. Pat. No. 6,948,829, there is described a light emitting diode (LED) light bulb that includes plural individual elements as sub-assembly elements of the overall light bulb. Different sub-assembly elements of a lens, a LED printed circuit board, a housing also functioning as a heat sink, a lower housing, and other individual sub-assembly components are utilized. The LED printed circuit board sub-assembly containing the LEDs can also be provided relatively close to a base.

In U.S. Pat. No. 6,851,834, there is described a light fixture which consists of one or more LED packaging systems within a housing. Each LED packaging system includes one or more LED light sources that simultaneously shines onto opposing reflecting surfaces, then shines forward through encapsulation material. The housing consists of a cluster of prewired sockets with an outer reflective surface. Electrical wiring runs from the rear of the first socket and then to an adjacent socket in a daisy chain fashion. Each socket includes connectors configured to provide each LED packaging system with a source of electricity. The housing has diffusers that adjust the light to an evenly distributed appearance.

In U.S. Pat. No. 6,827,467, there is described an illuminating apparatus having a light source, an optical unit disposed on the object side of the light source having a lens portion having positive refractive power in the central portion thereof, incidence surfaces on which light from the light source is incident and reflecting surfaces for totally reflecting the incident light, on both sides of the lens portion, and an emergence surface from which the light reflected by the reflecting surfaces emerges. A beam emerging from the lens portion and a beam emerging from the emergence surface intersect with each other substantially at the same place in their condensed state. A second optical unit has a plurality of prism portions, wherein the relative interval between the optical unit and the second optical unit are changed to vary an irradiation angle.

In U.S. Pat. No. 6,793,374, there is described an LED lamp which has the appearance of a conventional incandescent lamp, this LED lamp including a gear column which is connected between a cap and substrates, all encased within an envelope (bulb). The substrates are arranged as a polyhedron with planar surfaces, with each surface having a plurality of LED's thereon. The polyhedron shape thus assures output in a variety of directions. The gear column also has a heat-dissipater, which interconnects the substrates and the lamp cap.

In U.S. Pat. No. 6,709,132, there is described an LED bulb with an intensity allegedly close to that of tungsten bulbs. The described "problem" in directivity of LED bulbs is allegedly solved. The LED bulb comprises a printed circuit board which is flat when developed and then bent to form a cage. A plurality of LEDs are disposed on the printed circuit board, and a transparent or semi-transparent cover encloses the board. The board may have a plurality of belt-like branches which extend in radial directions.

In U.S. Pat. No. 6,659,632, there is described an LED lamp which includes multiple LED members, a plane circuit board, an LED fixing cover, a circuit board mounting seat, a drive circuit, and an LED lamp base having a bulb copper head. The plane circuit board is initially cut to form a multiple-ring shape. Then, the multiple LED members are arranged and soldered on the plane circuit board. The circuit board mounting seat is next mounted on the bottom of the plane circuit board, thereby forming a spatial shape having a convex arcuate face. The plane circuit board and the circuit board mounting seat are next mounted in the LED lamp base. Then, the LED fixing cover is mounted on the LED lamp base.

In U.S. Pat. No. 6,657,382, there is described a light emitting device and display apparatus using a plurality of LEDs. The device has a light emitting chip and a first layer covering the light emitting chip. A second layer including a light scattering material is provided over the first layer, and the surface of second layer has a plurality of protrusions which follow the topology of the light scattering material. The display apparatus is formed by disposing these light emitting devices in an array on a substrate.

In U.S. Pat. No. 6,568,834, there is described a light modifying material composed of ethylene/butene-1 copolymer or propylene homopolymer or a combination of the two, and lighting devices using the material in a light transmitting cover. It is preferred that the light source for the devices is a semiconductor or light emitting diode (LED), to produce an energy efficient light source. The lamp may use a bayonet-type base.

In U.S. Pat. No. 6,527,419, there is described an illumination assembly consisting of a light source such as an LED that produces a near field image, and a means of imaging and focusing the near field image. The LED includes a chemical light emitting chip, a reflector cup and a phosphor coating over both the emitter chip and the reflector cup to produce an allegedly uniform, concentrated, high intensity near field image. The LED also has a clear housing having a narrow angle beam distribution. The means for imaging and focusing the near field image is a convex optical lens having a radius of curvature equal to twice the overall thickness of the lens. The optical lens is installed in fixed spaced relation to the LED such that the lens is imaging the reflector cup of the LED rather than the light on the surface clear LED housing.

In U.S. Pat. No. 6,507,290, there is described a light source in the form of an LED cluster module suitable for use as an aircraft forward position light source. The light source comprises multiple LED components mounted on a base structure together with supporting electronic components to regulate the function of the LED components. The LED components are configured on the base structure in a manner so as to be capable of complying with the Federal Aviation Regulations minimum light intensities or candela requirements and color specifications, while in a preferred implementation using a traditional aircraft 28-volt power supply.

In U.S. Pat. No. 6,328,456, there is described an LED lamp and method of using one or more lamps, and portable lighting products such as flashlights using such LED lamps. The LED lamp allegedly provides uniformly distributed light that radiates spherically approximately 270 degrees. The chip is encased in an envelope surrounding the chip, with the envelope extending from a first position below the position of the chip to a second position above the chip. The second position of the envelope forms a lens with the surface of the lens being configured and positioned relative to the chip such that a substantially uniform portion of light emitted from the chip is reflected off of the surface.

In U.S. Pat. No. 6,161,910, there is described an LED reading light assembly which includes an optical assembly, a circuit board, a housing, and a control system. The optical assembly includes a holographic lens and an LED assembly in which the circuit board has a plurality of LEDs disposed on the outward facing side thereof. The power circuit board provides a constant source of electric current to power the LEDs. The housing includes a housing plate disposed behind the LED circuit board and a black anodized fin plate. The control system includes a temperature protection circuit monitoring the ambient temperature at the LED assembly during operation and adjusting the power supplied to the LEDs to maintain the ambient temperature within a selected temperature range.

In U.S. Pat. No. 5,947,588, there is described an LED light bulb which can be used in conjunction with a conventional light fixture mounted to a vehicle. The light fixture includes a hollow lens and a base plate attached to the lens. The base plate has a conventional socket housing with one or more contacts which is electrically coupled to a power source. The LED light bulb comprises an electrical circuit board, a plurality of light-emitting diodes mounted to the circuit board and extending upwardly in a single direction, and a bayonet-type connection post attached to the circuit board and adapted to be connected to the socket housing.

In U.S. Pat. No. 5,931,570, there is described an LED lamp which consists of a light emitting bulb-shaped unit including an epoxy resin bulb-shaped portion; two leads (of which one end is extended outside the bulb-shaped portion and the other end is embedded in the bulb-shaped portion), and an LED chip connected to the ends of the two leads and embedded in the bulb-shaped portion. The surface of the bulb-shaped portion of the LED lamp is formed in an appropriate process to be either a frosted glass surface, a cut-diamond surface, a surface covered with small particles, or an optically-diffusing cap.

In U.S. Pat. No. 5,897,195, there is described an illuminator with a cylindrical or truncated-conical array of LEDs producing collimated light beams that are directed onto axially-spaced, inclined surfaces formed on the outer periphery of a hollow, similarly shaped (i.e., cylindrical or truncated-conically shaped) Fresnel-like diffuser which refracts and directs rings of light beams onto the surface of a workpiece at angles of incidence ranging anywhere from fifteen to eighty degrees. The array of LEDs is surrounded by a circuit board which supplies power selectively to illuminate the LEDs. The Fresnel-like diffusers have in the outer peripheral surfaces thereof circumferential grooves forming annular, prism-shaped projections which differ in shape depending upon the desired angle of incidence of the light beams that are to be projected.

In U.S. Pat. No. 5,879,076, there is described a method and apparatus for light transmission adapted for use in a reflective belt, safety vest, or similar devices requiring visibility of a bright and/or reflective material where a light source of one or more lighting elements (e.g., LEDs) is positioned to transmit light along a self-supporting elongated light transmitting member of a hot-melt adhesive thermoplastic material. A flashing circuit for the light source includes a battery pack convertible to direct current voltage.

In U.S. Pat. No. 5,865,529, there is described an LED lamp which allegedly allows a 360 degree viewing angle in a horizontal plane about its central vertical axis, as well as, a 360 degree viewing angle about the vertical circle. The lamp utilizes a concave lens to establish a focal point within the envelope to re-radiate the radiant energy.

In U.S. Pat. No. 5,808,718, there is described an LED print head is for use in an LED printer. The LED print head has an LED circuit board on which a plurality of LED chips are mounted in line, and a lens assembly having rod lenses for focusing light emitted from the LED chips on a surface of a photosensitive drum in the LED printer. A first member or slider engages either the LED circuit board or the lens assembly and is adapted to displace stepwise to cause either the LED circuit board or the lens assembly to flex stepwise relative to the surface of the photosensitive drum. A second member or slider engages said first member to movably hold said first member. The LED circuit board or lens assembly is flexed so that a point on the photosensitive drum and the surface of the corresponding LED form a pair of conjugate points with respect to the corresponding rod lens.

In U.S. Pat. No. 5,528,474, there is described lamp, such as for truck trailers and/or tractors, which is provided with LEDs mounted to a circuit board placed in a housing. The LED's and circuit boards are fully embedded in a resin material cured with thermally conductive particles suspended therein for conducting excess heat to the outer aluminum housing and the outer environment. The lens cover has a series of parallel, elongated lens ribs providing constant optics while allowing additional LEDs to be positioned in a row behind a lens rib. The LED circuit board has large traces to enhance heat dissipation.

In U.S. Pat. No. 5,313,729, there is described an LED display unit comprising a printed circuit board with a plurality of LEDs on the board. Parts of the LED, except for light emitting sections thereof, are sealed by a resin. The LEDs having the portions thereof sealed by the resin are oriented in a case, with the cases being arranged on an attaching plate to form a large-sized display panel. The case has a rear face thereof which is brought to a configuration in which spaces exist between the attaching plate and portions of the case.

In U.S. Pat. No. 5,221,140, there is described a sub-miniature lamp in which a lamp body having a filament and an envelope is covered with a soft silicone rubber cap of a predetermined color having an opening at one end to a predetermined length of lead wires extending from the lamp body. A closure member is fitted to the opening of the envelope to seal the opening. The colored silicone rubber cap covers the envelope of the lamp body and is extended to a predetermined length of the lead wires, with the opened end of the cap fitted with an adhesive agent or a disc pad.

In U.S. Pat. No. 5,121,311, there is described an LED holder which uses two pivotably connected portions to mount an upper and a lower LED on a printed circuit board. The first portion has a pair of receptacles for holding the bodies of the LEDs, and a pair of bores extending from the bottom of each receptacle. The second portion has a pair of bores for receiving the leads of the top LED when the second portion is in an open position with respect to the first portion. Pivoting the second portion toward the first portion bends the leads of the top LED between the bores, and brings a guide surface to bear on the leads of the bottom LED, bending the bottom LED leads. Further pivoting the second portion latches it into place against the first portion, and holds the bent leads in position for connecting to a printed circuit board.

In U.S. Pat. No. 4,967,330, there is described an LED lamp having a generally hollow cylindrical encasement having at least one opening therein allowing gases and fluids exterior to the encasement to freely circulate within the interior thereof for cooling purposes. Embodiments include those wherein the encasement is screw-threaded and/or divided into sections with differing diameters.

In U.S. Pat. No. 4,929,866, there is described an LED automobile, e.g., tail light, lamp comprising a window through which light is released forwardly, a plurality of LEDs located at a corner of the window or behind the frame of the window, and a light reflector having a plurality of light reflecting faces whereby light emitted from the LEDs is reflected toward the window.

In U.S. Pat. No. 4,630,183, there is described an LED lamp and a method for producing thereof, in which at least one LED is connected between at least a pair of conductive members at the upper end portions thereof, the LED being embedded together with the conductive members in a molding of a light transmissible resin material, with the respective lower end portions of the conductive members being left exposed, and the respective exposed lower end portions of the conductive members being connected to a lamp base or cap. A contact member supports the lower end of the lamp base or cap and is insulated from the lamp base or cap.

In U.S. Pat. No. 4,580,196, there is described an arrangement for changing the illumination in an aircraft cockpit or other enclosure to a spectrum compatible with night vision infrared equipment. Selected LED elements are employed in multiple element arrays using a tether connected package that can be excited directly from existing wiring in fixtures.

In U.S. Pat. No. 4,559,589, there is described a lighting fixture including an enclosure, means disposed in the enclosure for supplying a central source of light therein, and a concave, generally parabolic reflector for directing a main beam of light out of the enclosure from the source generally along a given optical axis. The central source of light is located at the focal region of the concave reflector, the concave reflector includes a light penetrable region disposed at one side of the optical axis in a horizontal plane in common with the central light source, and the light-penetrable region forms an escape window out of the enclosure for part of the light from the source.

In U.S. Pat. No. 4,555,749, there is described a tie-bar of variable length for mechanically linking a desired number of lamps (such as LEDs) which includes dove-tailed channels with a "v-shaped" groove in each dove-tail channel. Each lamp is disposed in a housing having a compatible dove-tailed mounting channel designed to fit half of adjacent tie-bar channels on the tie-bar assembly. The "v-shaped" grooves are used to break the tie-bar to a desired length for mounting a required number of lamp housings.

In U.S. Pat. No. 4,329,737, there is described an LED arrangement with a light-emitting diode that is light-transmissive in an axial direction of the type used in examining instruments. The LED serves as a constant light source in conjunction with a diffusion disk, such as for fixation point stimuli, while the disk also serves as a stimulus that is lit by an additional, switchable light source, such as an incandescent lamp. Light from the incandescent lamp is transmitted through a light guide, such as an optical fiber, and through the light-emitting diode to the disk. A color filter is arranged between the additional light source and the light-emitting diode and both the additional light source and light-emitting diode are axially displaceable relative to the diffusion disk so as to enable adjustment of the respective luminous densities.

In U.S. Pat. No. 4,296,460, there is described a battery-powered lamp having a box-like casing with a top and side walls for housing at least one battery. At least one of the side walls has a depression which provides a generally planar depressed portion having an opening there-through. A light source is supported in the casing. A lens, through which light from the light source can be transmitted, has a peripheral rim which is a friction fit in the opening. On its peripheral rim is a plurality of ratchet-like teeth mutually spaced. These make snap fits with and locate behind the material of the side wall bounding the opening so as to resist lens removal. Outside the peripheral rim of the lens is a surrounding flange which limits the depth of insertion of the lens in its opening. The side wall bounding the opening has a plurality of spaced notches which register with the lens teeth to prevent rotation of the lens relative to the opening. The lens teeth are triangular in configuration and are integral with the lens rim. Two opposite side walls each has a depression in which an opening is disposed. The lens is a friction fit in each of the openings.

In U.S. Pat. No. 4,270,162, there is described a beacon lamp which includes a point source of light located surrounded by a transparent cap which is in the shape of a solid of revolution about an axis which forms at least one annular lens. The profiles of the optical surfaces of the lenses are such that these produce a cap which can be molded and which concentrates much of the light.

In U.S. Pat. No. 4,253,135, there is described a lamp having a central core that provides up to four faces for the support of illuminating units. The central core is made of four elongated, square core members which are spaced from each other by interfitting cross members to which the base and top plates of the illuminating units are secured. The complete lamps may be mounted one above the other, suspended on a chain, or supported on a base or pedestal to provide illumination. Each illuminating unit has a socket which supports a bulb which is enclosed between bottom and top plates by a U-shaped translucent element.

In U.S. Pat. No. 4,075,471, there is described a lamp assembly having a housing of which part defines a parabolic or paraboloidal mirror and part defines part of an ellipsoidal reflector. A lamp filament is mounted at the inner focal point of the reflector and the focal point of the mirror coincides with the outer focal point of the reflector. The housing has a lens element defining a window through which light is directed from the mirror. In one embodiment, an additional mirror and lens element are provided for receiving light from the reflector with the additional mirror directing the light in the opposite direction to the light directed by the first mirror. Further mirrors may be provided for increasing the horizontal spread of light.

As defined herein, the present invention represents an improvement in LED lamp design by providing an LED lighting assembly adapted for use in a lamp which may accommodate several such assemblies in order to provide a concentrated light output of desired intensity while assuring effective heat removal from the several closely positioned LEDs. The invention is thus ideally suited for use within a demanding environment such as during surgical and dental procedures, while still assuring a safe product. As defined herein, the invention may be produced using many conventional PCB technologies to thus assure a finished assembly of relatively low cost for a product having such capabilities It is believed that such a lighting assembly and corresponding lamp will constitute significant advancements in the art.

OBJECTS AND SUMMARY OF THE INVENTION

It is, therefore, a primary object of the present invention to enhance the lighting art.

It is a particular object of this invention to enhance the lighting art which utilizes LED's as the light source.

It is another object of this invention to provide an LED lighting assembly and LED lamp adapted for having one or more such assemblies as part thereof which possess the many advantageous features defined herein, thereby making the invention capable of being used in demanding environments such as surgical and dental facilities.

It is a still further object of this invention to provide a lamp and lighting assembly of the type defined above which may be manufactured in a facile manner and at relatively low cost, in comparison to many known LED lamp products.

According to one aspect of the invention, there is provided an LED lighting assembly comprising a thermally conductive member having a first surface and including a substantially central portion and a plurality of projecting portions, a layer of dielectric material positioned on the first surface of the thermally conductive member, including on the substantially central portion and plurality of projecting portions, a circuit formed on the layer of dielectric material, this circuit adapted for being electrically coupled to a power source for providing electrical power to the LED lighting assembly, and a plurality of LEDs, each of these LEDs including a body, a lens and a plurality of projecting conductive leads, selected ones of the LEDs being positioned on one of the projecting portions of the thermally conductive member and electrically coupled to the circuit formed on the layer of dielectric material and adapted for receiving the electrical power from the power source, the layer of dielectric material including a plurality of openings therein, each of the LEDs being positioned within a respective one of the openings so as to be thermally coupled to the first surface of the thermally conductive member.

According to another aspect of the invention, there is provided an LED lamp comprising a housing, a plurality of LED lighting assemblies spacedly positioned within the housing in a predetermined pattern, each of these LED lighting assemblies including a thermally conductive member having a first surface and including a substantially central portion and a plurality of projecting portions, a layer of dielectric material positioned on the first surface of the thermally conductive member, including on the substantially central portion and plurality of projecting portions, a circuit formed on the layer of dielectric material, a plurality of LEDs, each of these LEDs including a body, a lens and a plurality of projecting conductive leads, selected ones of the LEDs being positioned on one of the projecting portions of the thermally conductive member and electrically coupled to the circuit formed on the layer of dielectric material, the layer of dielectric material including a plurality of openings therein, each of the LEDs being positioned within a respective one of the openings so as to be thermally coupled to the first surface of the thermally conductive member, a light-transmitting cover positioned on the housing and adapted for having light beams emitted by the LED lighting assemblies pass there-through during operation of the LED lamp, and a connector for electrically connecting the circuits of each of the LED lighting assemblies to a power source for providing electrical power to these circuits so as to power each of the LED lighting assemblies.

BEST MODE FOR CARRYING OUT THE INVENTION

For a better understanding of the present invention, together with other and further objects, advantages and capabilities thereof, reference is made to the following disclosure and appended claims in connection with the above-described drawings. Like figure numbers will be used from figure to figure to identify like elements in these drawings.

Figure 1:
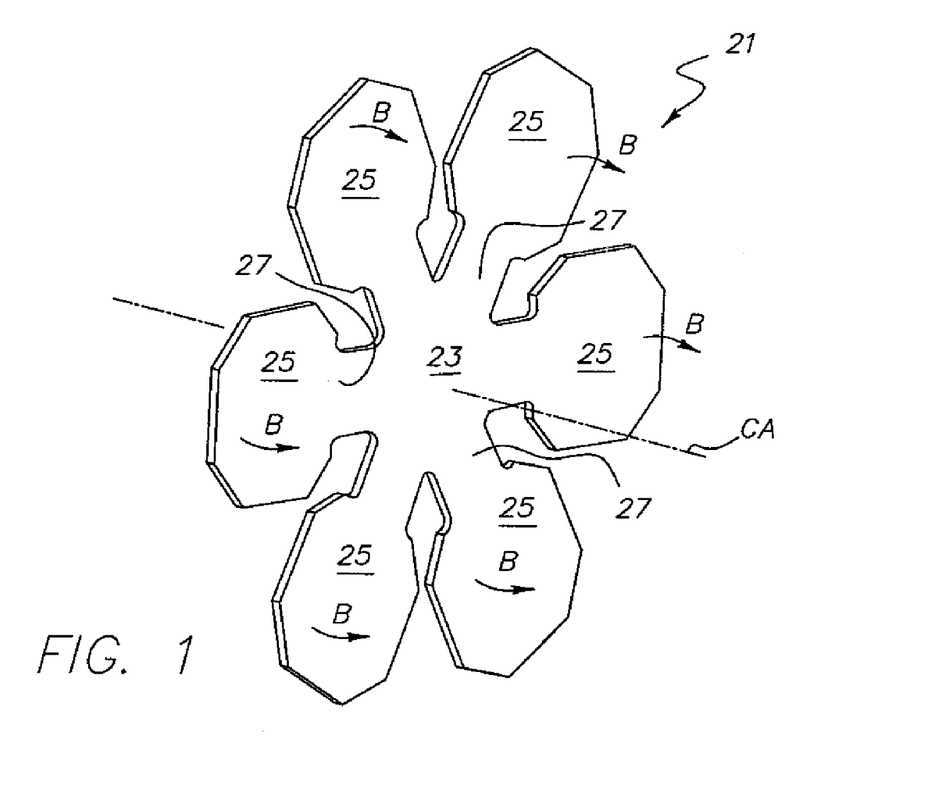
FIG. 1 is a perspective view of a thermally conductive member according to one embodiment of the invention.

In FIG. 1, there is shown a bendable thermally conductive member 21 according to one embodiment of the invention, member 21 being adapted for forming part of an LED lighting assembly (defined in greater detail herein-below). Member 21 includes a substantially central portion 23 surrounded by a plurality of bendable projecting "wing" portions 25, these wing portions arranged in a substantially annular pattern about the substantially central portion 23. In one embodiment (as shown), a total of six "wing" portions 25 are provided. It is understood however, that the invention is not limited to using six because other numbers of such portions are possible. Nor is the invention limited to the particular orientation shown in FIG. 1, as others, e.g., L-shaped, rectangular-shaped, etc. are possible. Member 21 is comprised of metal (and is thus a metal plate structure), the preferred being the sound heat conducting metal, copper. Alternative metals for member 21 include aluminum and copper alloys.

In the example shown in FIG. 1, member 21 may have a thickness of about fifty mils (a mil being one thousandths of an inch) and a diameter (maximum distance across the outermost, opposing edges) of about one hundred millimeters. The particular thickness of this metal plate member is important with respect to the invention because it is possible to bend the outer projecting "wing" portions with respect to the member's central axis (passing perpendicularly through the central portion 23). Doing so facilitates alignment of the individual LEDs (defined below) positioned thereon. Further description is provided below, especially with respect to FIGS. 7 and 8. Each projecting portion 25 has a total surface area of about 700 square millimeters, while the surface area of central portion 23 is also about 700 square millimeters. These areas do not include the surface area of each of the six connecting legs 27 which connect central portion 23 to the portions 25. Each of these connecting areas is approximately 200 square millimeters.

Figure 2:
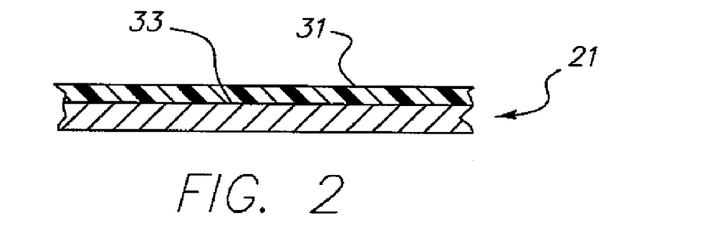
FIGS. 2-6 are partial side elevational views, on an enlarged scale over the view of FIG. 1, illustrating the steps of forming an LED lighting assembly, according to one embodiment of the invention.

FIGS. 2-6 are enlarged (compared to FIG. 1), partial side views, in section, illustrating the steps of forming a circuit on member 21 in FIG. 1, in addition to thereafter positioning one of the invention's LEDs thereon (representing how all of the LEDs may be so positioned). In FIG. 2, member 21 is provided with a layer 31 of dielectric material on a first surface 33 thereof. Layer 31 is deposited over the entire surface 33, which includes central portion 23, the outwardly projecting portions 25 and the six interconnecting portions 27. Layer 31, preferably a photo-imageable material, is laminated to the copper member 21 using conventional PCB lamination processing. Other suitable dielectric materials for layer 31 include polytetrafluoroethylene (e.g., Teflon), polyimides, polyamides, cyanate resins, and other like materials. One good example of such other material is produced under the product name "DriClad" dielectric material by the Assignee of this invention, Endicott Interconnect Technologies, Inc. ("DriClad" is a registered trademark of Endicott Interconnect Technologies, Inc.). Layer 31 may also be applied to the copper thermally conductive member 21 by other means, including spin coating, slot die coating, or ink jet printing. In yet another embodiment, this layer may be in the form of what is known in the art as resin coated copper (RCC), in which a cured resin (epoxy) includes a metal (copper) layer thereon. This dual layered member may then be bonded to member 21, preferably using conventional PCB lamination processing.

Figure 3:
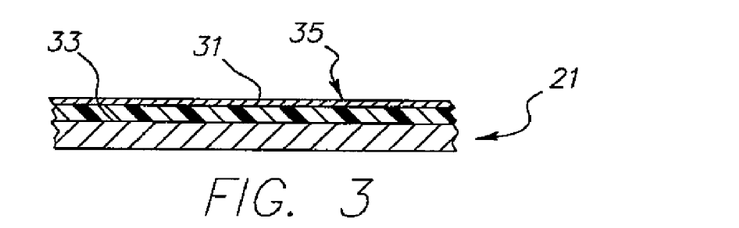
Figure 4:
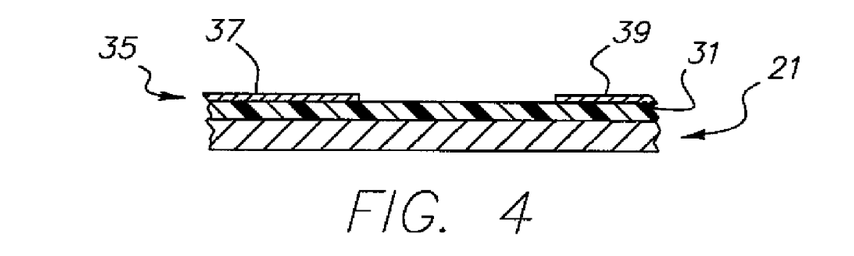

In FIG. 3, the structure of FIG. 2 has a thin layer 35 of metal bonded onto the upper (exposed) surface of layer 31, and thus opposite the surface bonded to member 21. Layer 35 is bonded in one embodiment of the invention by taking a thin copper sheet (e.g., one-half ounce copper) and laminating it to layer 31 using, again, conventional PCB lamination processing. As stated, if layer 31 is provided in the form of RCC, the thin copper layer 35 is provided simultaneously with this dielectric onto surface 33 and a separate bonding step is not necessary. Other metals may be used for layer 35, including copper alloys and aluminum. It is also possible to add further conductive layering, e.g., nickel and gold, atop the "base" copper layer 35, for providing enhanced conductivity if same is desired or considered necessary for the particular environment in which the final product is to be used. Such added layering is not shown in the drawings, but may be added using conventional electroplating (including electro-less or electrolytic) processing known in the PCB art. Once the layer 35 (and any additional layers if desired) is firmly in place on layer 31, this metallurgy may now be subjected to conventional photolithography processing in which a photo-resist material (not shown) is deposited over the exposed metal, exposed, and "developed" away, leaving an open pattern of copper or copper alloy for subsequent etching. This exposed copper is thus etched away, leaving the conductors 37 and 39 as shown in FIG. 4. Alternatively, if layer 31 is provided in the form of RCC, it is possible to form openings (45, described below) therein using laser ablation, which acts to remove both the metal and underlying dielectric in a simultaneous manner.

As understood from the following, several such conductors are actually formed to produce the desired circuit pattern of conductors and coupling dual signal lines for accommodating and connecting the various LEDs, respectively. (Please see more below.) In the embodiment shown in FIG. 4, each formed conductor 37 and 39 (and others) will have a thickness of from about 0.7 mil to about 2.8 mils, and in a preferred embodiment, may be 1.4 mils thick. As yet another alternative to the above procedures, the individual conductors may be formed using what is referred to as a full panel acid copper plating process following which subtractive circuitization occurs. The resulting circuit pattern of conductors and connecting lines is designed to accommodate the corresponding pattern of conductors (41) of the associated LEDs to be mounted on the thermally conductive member and circuit composite and coupled thereto. Conductors 37 and 39 as shown in FIG. 4 are spaced apart and adapted for being coupled to corresponding projecting leads 41 (FIG. 6) of one of the LEDs 43 used in this invention and thus to the anode and cathode electrodes of each chip. It is understood that other pairs of such conductors are necessary for the remaining LEDs.

Figure 5:
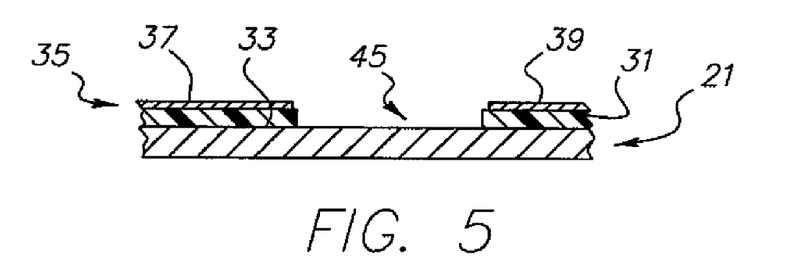
Figure 6:
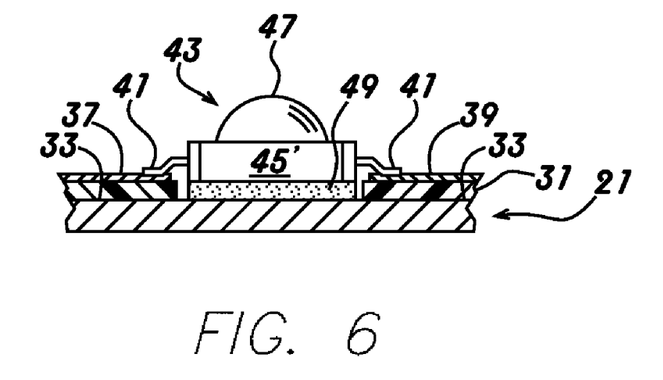

In FIG. 5, a substantially rectangular shaped opening 45 (as also mentioned above) is formed within layer 31 of the dielectric material between the opposed conductors. Such an opening is formed in each location where an LED is to be positioned and the view in FIG. 5 is meant to be representative of all such locations. This hole formation may be accomplished, as stated, using laser ablation in which a laser beam is directed onto the layer 31 with sufficient strength to ablate desired quantities of the dielectric material in a specified pattern (here, rectangular). Such laser ablation is strong enough to also simultaneously remove the thin copper of layer 35, as mentioned above, including for the situations where layer 31 (and metal layer 35) is provided in the form of RCC. If so used, it is thus possible to eliminate the need for using photolithographic processing as mentioned above, to selectively remove portions of layer 35. Other opening configurations are possible, including circular, depending on the configuration of the body 45' of the LED 43.

In the embodiment of FIG. 5, body 45', known to include the chip and other electrical features of the LED, is substantially rectangular (boxlike). LED 43 also includes a lens 47, as is typical in many LEDs. The lens 47 may be of a known transparent synthetic resin material and may be held onto the chip by a conventional die-bonding material. Significantly, the body 45' of LED 43 is secured to the exposed portion of the upper surface 33 of thermally conductive member 21 using a thermal adhesive 49. Adhesive 49 is deposited within the opening 45 onto the exposed upper surface and the body then lowered within the opening until contacting the adhesive. The adhesive is a sound thermal conductor, and thus assures an optimal flow of heat generated by the LED during operation thereof. Such heat passes directly into the copper member 21 and is thus dissipated throughout the member and into the ambient surrounding the finished product. In this means, it is thus possible to effectively remove the heat generated by the several LEDs (here, seven, but as stated many more may be utilized). Such effective removal serves to assure a prolonged life for each LED, and thus the final lamp product. One example of a suitable thermally conductive adhesive is a one-component, heat curable silicon thermal paste available from GE Toshiba Silicones Company, Ltd. under their product code "TSE3281-G." This paste possesses a thermal conductivity of 1.68 W/m×K., a dielectric loss of 0.002 (at 60 Hz) and a viscosity of 60 (at 23 degrees Celsius). Another adhesive is "Ther-O-Bond 1500" adhesive available from Aavid Thermalloy (having a business location in Laconia, N.H.), and has a very low surface tension and a flowable viscosity, which affords excellent air release. "Ther-O-Bond 1500" also possesses a low coefficient of thermal expansion. Still other suitable thermally conductive adhesives include "Arctic Silver 5" adhesive available from Arctic Silver, Inc. (having a business location in Visalia, Calif.), a high-density filling of micronized silver and enhanced thermally conductive ceramic particles. Other adhesives, including other silicon-based adhesives, are usable in the invention and further description of same is not considered necessary. It is also possible to utilize known thermal tapes (when cut and secured) in the invention. Approximately 0.1 gram of adhesive is used per LED site on member 21.

Figure 7:
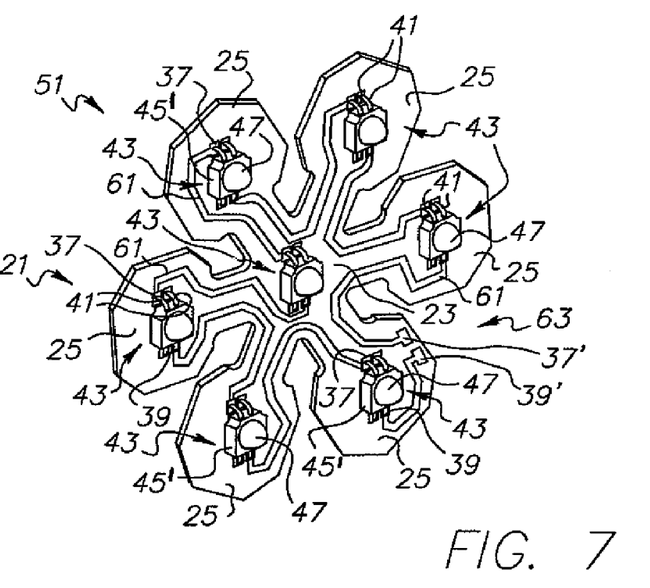
FIG. 7 is a perspective view, on a scale smaller than that of FIGS. 2-6, illustrating an LED lighting assembly according to one embodiment of the invention.

In FIG. 7, there is shown an LED lighting assembly 51 according to one embodiment of the invention. Assembly 51 includes thermally conductive member 21 of FIG. 1, having a plurality of LED's 43 spacedly positioned thereon. Understandably, each LED is thermally bonded to member 21 in the manner defined herein-above, such that the projecting leads 41 thereof are bonded to the corresponding conductors (37, 39) provided for each LED. In a preferred embodiment, each lead 41 is soldered onto the accommodating metal conductor, preferably using a conventional solder composition such as 63:37 tin:lead solder. It is also possible to use one of the more recent "no-lead" solders available on the market. If a thermal paste such as the aforementioned "TSE3281-G" paste is used, full cure of the paste may occur simultaneously with the soldering operation, as the heat generated during such soldering may be sufficient to effect such curing. (In the case of the "TSE3281-G", this paste will normally cure in one hour at 150 degrees Celsius, and in two hours at 125 degrees Celsius.) As shown in FIG. 7, the conductors designed to receive leads 41 are interconnected in a predetermined circuit pattern by individual single lines 61, each of these lines formed simultaneously with the formation of conductors 37 and 39 from the copper layer 35. The pattern as shown assures two lines to each LED 43 positioned on the projecting portions 25, in addition to the centrally disposed LED on the substantially central portion 23 of member 21. Power from a suitable power source such as a 30 V DC supply or a 120 V AC is supplied using a suitable electrical connector (not shown in FIG. 7) which may be coupled to a power site 63 on member 21, this site including two conductors 37' and 39'. The remainder of the circuit, including the lines and LED conductors, are understandably connected to site 63. Although each LED is shown in FIG. 7 as including two projecting leads 41 from each opposing side of its body 45', it is only necessary to couple one lead 41 from each side to form the connection scheme depicted in FIG. 7.

Figure 8:
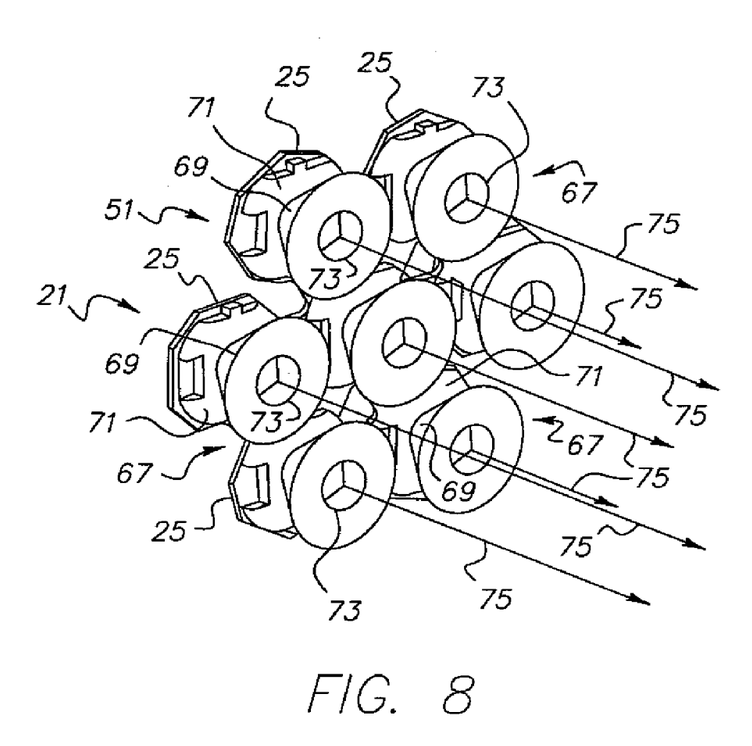
FIG. 8 is a view of the LED lighting assembly of FIG. 7 further including a plurality of simple lenses positioned thereon.

In FIG. 8, the assembly of FIG. 7 is provided with a plurality of simple lenses 67, one for each of the positioned LEDs 43 (not shown because these are hidden under each simple lens 67). Each simple lens includes a lens member 73 which includes a "base" member 71 which in turn is attached to a respective projecting portion 25 of member 21 over the already positioned LED. Each lens member 73 serves to collect virtually all energy emitted by the respective LED to in turn enable maximum control of light distribution to provide a singular, concentrated light beam 75 from each LED. Lens member 73 is thus able to direct the light beam in a particular direction, and, in this case, in a manner such that the produced multiple beams will converge as a specified location F.P. (FIGS. 8-10), hereinafter also referred to as the lighting assembly's focal point. This combined structure is, as shown, a compact, ultra-thin "luminaire" for providing enhanced light output in a desired beam pattern such that the beams will converge (and thus be concentrated) on a designated location at a spaced distance from the front of the lighting assembly. In the case of where the invention is used in combination with other similar lighting assemblies in an LED lamp (as is the case here) designed to illuminate a patient, this maximum concentration of light, when combined with that from the other lighting assemblies, is thus ideal for the desired medical procedure (e.g., surgery, dental work) to be performed. Significantly, this total light output is sufficiently bright enough to adequately illuminate the patient while assuring a relatively cool source of light, unlike many known luminaires currently used in medical and dental applications. This is due to the exceptional heat removal offered by the thermally conductive member 21, as explained above. Each of these assemblies (LED-lens member) is thus integrated as a single set of components and, for even greater flexibility, the lens member 73 may be a detachable element that can be replaced depending on the desired properties of light to be produced. For example, the lens member may instead provide a spread pattern of light, rather than the concentrated beam as shown. In the above example, each lighting assembly 51 is able to produce about 20,000 lux (a lux being a single lumen of light per square meter) at the F.P.

One particularly significant feature of the invention is that each of the projecting portions 25 of member 21 are bent slightly toward the center axis (CA, FIG. 1) as indicated by the arrows B in order to optimize the light output from each lighting assembly in the desired direction to produce the desired pattern. Such bending preferably occurs subsequent to the aforementioned LED positioning, which, as defined, occurs after formation of the openings 45 within the layer 31 of dielectric material and the formation of the circuitry on layer 31. Such bending also preferably occurs prior to positioning of simple lenses 67. This bending enables the manufacturer to precisely orient each of the LEDs so as to assure optimal output there-from. It is also within the scope of the invention to provide such bending after positioning of the lens members 73 shown in FIG. 8. This capability is deemed truly unique because it allows member 21 to assist in orienting each of the LEDs for precise output beam concentration while still offering exceptional heat transfer from the heated LEDs during operation of the lighting assembly, as well as the LED lamp utilizing same. Providing a thermally conductive member of the proper metal and thickness enables this bending to occur, while still assuring that each of the LEDs will be strategically positioned throughout the life of the LED lamp using same. This further assures that the projecting portions will not eventually be deflected backward to their original positions, the result of which would be to alter the total light concentration. Of further significance, bendable member is of a thickness which prevents subsequent deflection thereof by the amount of heat generated. Thus, optimum light output is assured because the projecting portions maintain their angular relationship even during generation of heat at relatively high temperatures. The invention is able to provide such advantageous features using a relatively simple design and elements.

Figure 9:
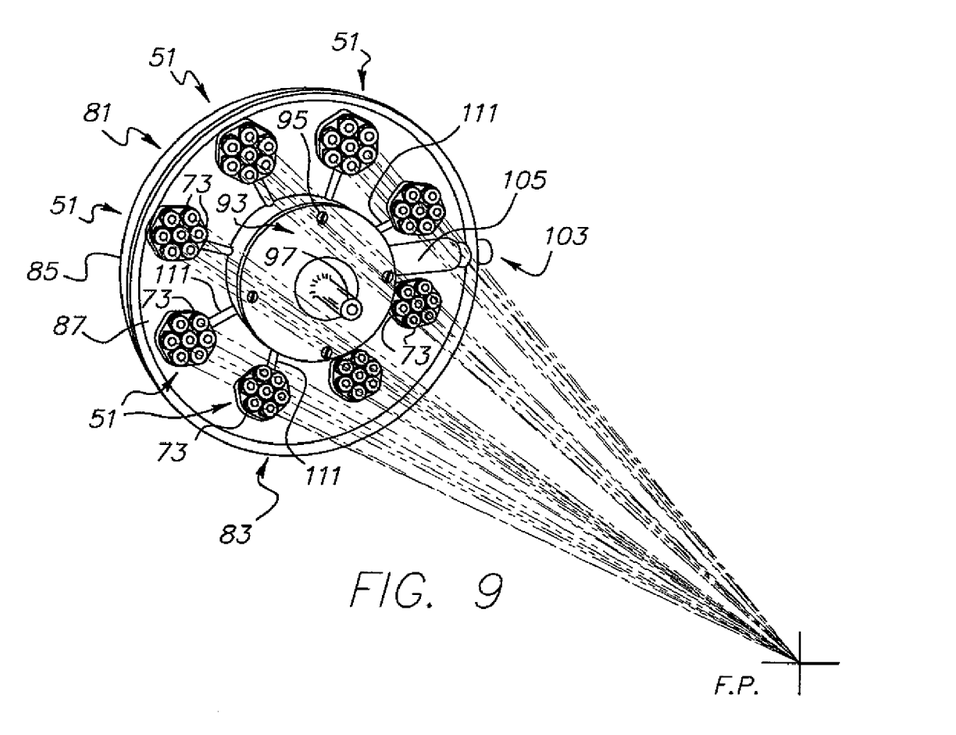
FIG. 9 is a perspective view of an LED lamp, according to one embodiment of the invention.
Figure 10:
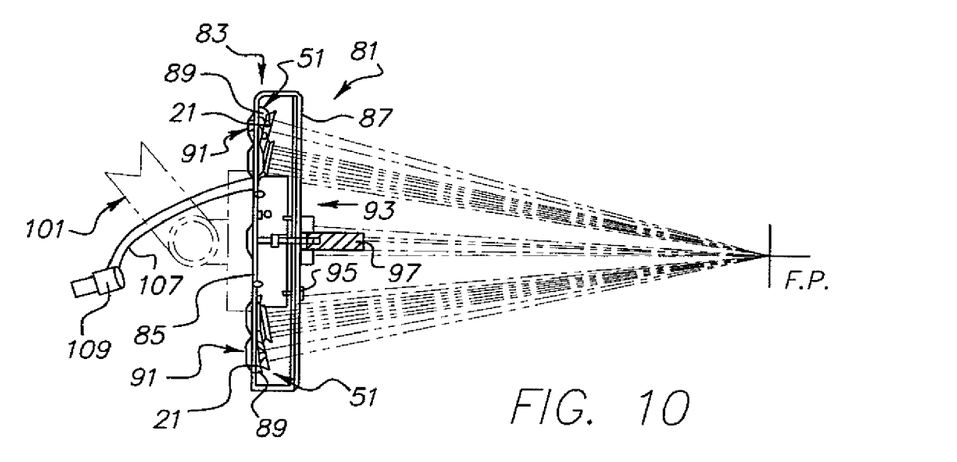
FIG. 10 is a side elevational view of the LED lamp of FIG. 9.
Figure 11:
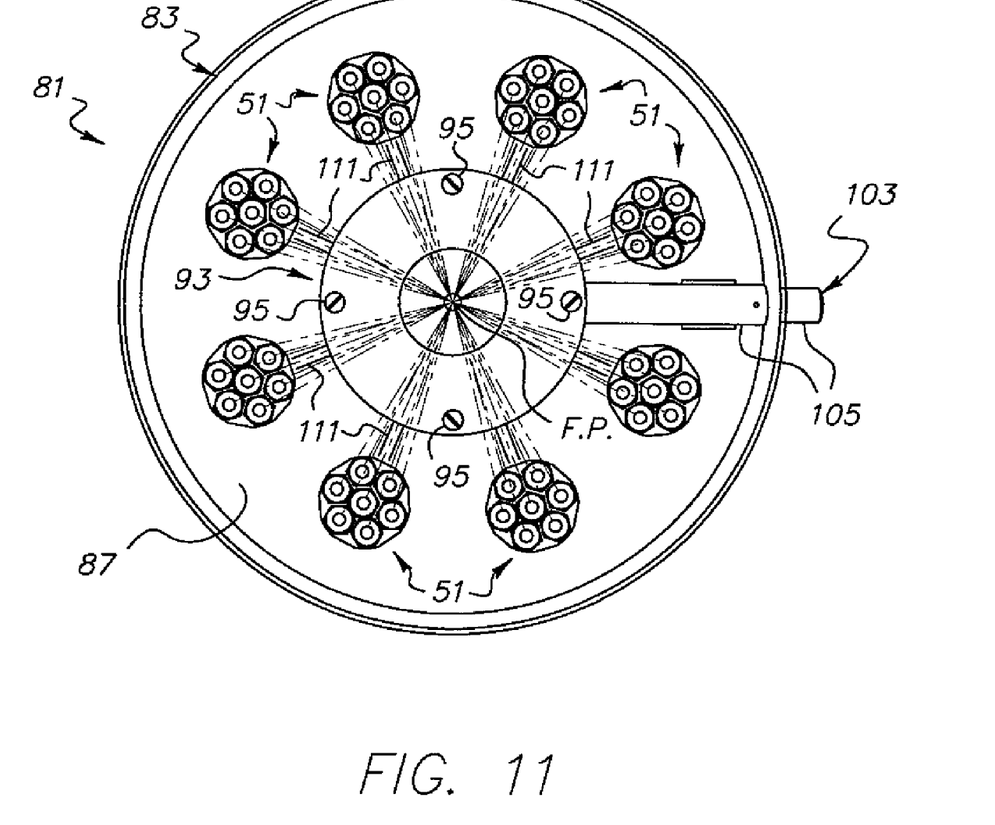
FIG. 11 is a front elevational view of the LED lamp of FIGS. 9 and 10.

In FIGS. 9-11, there is shown an LED lamp 81 according to one embodiment of the invention. Lamp 11 is designed for having a plurality of LED lighting assemblies 51 as defined and illustrated above therein, as shown. In this particular example, a total of eight such assemblies 51 are utilized, and arranged in an annular (circular) pattern along the lamp's outer periphery. Using eight such assemblies thus assures a total of fifty-six individual LEDs are used to provide the desired light output. That is, each LED provides a focused light beam onto a designated focal location (F.P.). In this example, LED lamp 81 was able to produce about 160,000 lux at focal location F.P. located at a distance of one meter from the front of the lamp. This distance is considered optimal for illuminating a subject (e.g., a patient) for surgical, dental and other operations. Additional light output can be provided by increasing the number of such lighting assemblies, including more closely positioning these together compared to the spacing shown herein. It is of course also possible to utilize fewer such assemblies, and thus provide a lamp with less output. This illustrates the versatility of the lamp of the invention, in that various levels of illumination are readily possible, all while assuring a relatively cool operating lamp due to the unique ability of each lighting assembly's thermally conductive member to transfer heat from the operating LEDs positioned thereon. As particularly shown in FIGS. 9-11, each assembly 51 focuses its own beam output onto the focal location F.P., this location having been pre-set when each assembly is produced. It is then only necessary to position the assemblies into the lamp structure to then provide a concentrated series of beams onto the now common focal location.

In the embodiment shown in FIGS. 9-11, LED lamp 81 includes a housing 83 which includes a rear portion 85 and a light-transmitting front cover 87. Rear portion is preferably metal to further increase the heat removal from the lamp. As seen in FIG. 10, each lighting assembly 51 is mounted onto the rear metal cover using a "pod" structure 89 which may comprise a plurality of metal legs or sides attached (e.g., soldered or welded) to the assembly's thermally conductive member 21. A retaining nut 91 or the like is used to secure the "pod" to the back wall of rear portion 85. In one example, rear portion 85 is comprised of stainless steel, while front cover 87 is glass. Because of the cooling afforded by the invention, the light-transmitting cover may also be of plastic. Suitable examples of such plastics include polymethyl methacrylate plastic, strength-modified polymethyl methacrylate, polycarbonate plastic, polystyrene plastic, styrene-acrylic-nitrile plastic, polyethylene terephthalate plastic, glycol-modified polyethylene terephthalate plastic, polyvinyl chloride plastic, transparent polyolefin plastic, acrylonitrile-butadiene-styrene (ABS) plastic or mixtures (blends) of various thermoplastics. Such plastics may be embedded with suitable fluorescent materials to produce a colored light, e.g., white or yellow.

LED lamp 81 further includes a central part 93 which includes the necessary LED supporting electronics (e.g., dimming circuitry, not shown) and which is secured to housing 83 by a plurality of screws 95 (see especially FIG. 11). Because lamp 81 is particularly designed for medical and dental applications, central part 93 further includes a projecting handle 97 which may be grasped by the lamp operator for providing more precise direction of the lamp's light, e.g., onto a surgical location of a patient. Lamp 81 is pivoted around a rotational connector arm 103 (FIGS. 9 and 11, below), but may alternatively be joined to a pivotal connecting arm assembly 101 (shown in phantom in FIG. 10) such that it will pivot and/or rotate in a facile manner by an operator. (These pivots are located at the lamp center of gravity so that once the lamp is moved to a desired position, it remains in that position.) Connecting arm assemblies such as those defined above are known in the art and further description is not considered necessary. The placement of the individual lighting assemblies 51 is such that the handle 97 is sufficiently recessed so as not to interfere with the desired light output.

If the environment surrounding the assembly is conducive, it is also within the scope of this invention to provide one or more vent holes (not shown) within the walls of rear portion 85 for still greater heat removal. Using the LED assemblies as taught herein, however, it is not likely that such additional venting is necessary for most working environments in which the invention is utilized.

In one example, lamp 81 possessed a diameter of about sixty centimeters, while the protruding center part 93 (that part surrounded by the assemblies 51) possessed a diameter of about twenty centimeters. Housing 83 in turn has a thickness (depth) of about eight centimeters. Lamp 81 is relatively light in weight, and in the embodiment as shown herein, may possess a weight of only about 6800 grams (15 lbs). In this example, LED lamp 81 possessed a rating of thirty volts DC (direct current) with an eight ampere rating. The output is white light with a color temperature of about 5500 degrees K. This lamp is thus an ideal replacement for many conventional incandescent and other lamps currently utilized in medical, dental and other like settings.

Lamp 81 further includes the aforementioned rotational connector arm 103 (FIGS. 9 and 11) for electrically connecting the circuits of each of the LED lighting assemblies to the defined power source for providing electrical power to these circuits. Connector arm 103 is connected to a conduit 105 which extends within housing 83 to the center part 93 and is coupled to the supporting electronics therein. The connector includes a flexible cable arm member 107 (FIG. 10) having a second connector 109 (FIG. 10) thereon. This second connector 109 is in turn adapted for being coupled to an appropriate socket (not shown) so as to provide necessary power to the lamp. As seen in FIGS. 9 and 11, conduits 111 project from central part 93 to each of the lighting assemblies 51. The desired wiring from the center part's electronics is positioned within these conduits and thus protected by same. The lamp operator is thus assured that he/she will not be in direct contact with any of the invention's circuitry or other electrically conductive elements when using the present invention.

Thus there has been shown and described an LED lamp and a lighting assembly adapted for use within such a lamp and having several individual LEDs as part thereof, these products providing several advantageous features over many known lighting assemblies, including known LED lamps and assemblies described in some of the above-identified patents.

Among these many advantages is the unique ability to initially focus each LED of the lighting assemblies prior to incorporation within the larger lamp structure. Such focusing is enhanced by use of a bendable thermally conductive member which is bent in a predetermined manner to focus the light, e.g., along a center or optical axis of the assembly, once the LEDs are positioned thereon. The assembly is thus "pre-focused" prior to final assembly within the lamp so as to provide optimal output onto the desired focal location of the lamp. This feature and others are possible while assuring effective heat escape of the heat generated by the several LEDs and thus assure a final lamp product which is not uncomfortably warm to operate. The LED lamp defined herein is also an ideal replacement for many conventional incandescent and other lamp products, including within the medical an dental industries. This lamp and the defined assemblies are also capable of being produced are relatively low costs, thereby passing on savings to the consumer.

While there have been shown and described what at present are considered the preferred embodiments of the invention, it will be obvious to those skilled in the art that various changes and modifications may be made therein without departing from the scope of the invention as defined by the appended claims.

What is claimed is:

1. An LED lighting assembly comprising:
a bendable thermally conductive member having a first surface and including a substantially central portion and a plurality of projecting bendable portions;
a layer of dielectric material positioned on said first surface of said thermally conductive member, including on said substantially central portion and said plurality of projecting portions, but not being present beneath LEDs;
a circuit formed on said layer of dielectric material, said circuit adapted for being electrically coupled to a power source for providing electrical power to said LED lighting assembly;
a plurality of individually aligned LEDs, each of said LEDs including a body, a lens and a plurality of projecting conductive leads, selected ones of said LEDs being positioned directly on one of said bendable projecting portions of said thermally conductive member and electrically coupled to said circuit formed on said layer of dielectric material and adapted for receiving said electrical power from said power source, said layer of dielectric material including a plurality of openings therein, each of said LEDs being positioned within a respective one of said openings so as to be thermally coupled to said first surface of said thermally conductive member; and
a focusing lens having a removable lens member disposed proximate each of said LEDs for concentrating light beams generated thereby in a predetermined direction, whereby said LED light beams are converged to a predetermined area.

2. The LED lighting assembly of claim 1 wherein said thermally conductive member having said first surface, said substantially central portion and including said plurality of bendable projecting portions comprises a metal plate.

3. The LED lighting assembly of claim 2 wherein said metal plate is comprised of copper.

4. The LED lighting assembly of claim 1 wherein said layer of dielectric material positioned on said first surface of said thermally conductive member comprises a photoimageable material.

5. The LED lighting assembly of claim 1 wherein said circuit is comprised of copper.

6. The LED lighting assembly of claim 1 further including a plurality of simple lenses, each of said simple lenses being positioned adjacent a respective one of said LEDs for directing a light beam from said respective one of said LEDs in a predetermined direction.

7. The LED lighting assembly of claim 6 wherein said predetermined direction of said light beam from each of said simple lenses results in said light beams from each of said LED's being focused on a fixed location at a pre-established distance from said LED lighting assembly.

8. The LED lighting assembly of claim 1 wherein at least one of said LEDs is positioned on said substantially central portion of said thermally conductive member and the remainder of said LEDs are positioned in a substantially annular pattern around said at least one LED positioned on said substantially central portion.

9. The LED lighting assembly of claim 8 wherein the number of said LEDs is seven.

10. The LED lighting assembly of claim 1 further including a plurality of quantities of thermal paste, each of said quantities of thermal paste positioned on said thermally conductive member within a respective one of said openings for bonding a respective one of said LEDs to said thermally conductive member.

11. An LED lamp comprising:
a housing;
a plurality of LED lighting assemblies spacedly positioned within said housing in a predetermined pattern, each of said LED lighting assemblies including a bendable thermally conductive member having a first surface and including a substantially central portion and a plurality of bendable projecting portions, a layer of photoimageable dielectric material positioned on said first surface of said thermally conductive member, including on said substantially central portion and said plurality of bendable projecting portions, but not beneath LEDs, a circuit formed on said layer of dielectric material, a plurality of LEDs, each of said LEDs including a body, a focusing lens having a removable lens member, and a plurality of projecting conductive leads, selected ones of said LEDs being positioned on one of said bendable projecting portions of said thermally conductive member and electrically coupled to said circuit formed on said layer of dielectric material, said layer of dielectric material including a plurality of openings therein, each of said LEDs being positioned within a respective one of said openings so as to be thermally coupled to said first surface of said thermally conductive member, whereby said LED light beams are converged to a predetermined area;
a light-transmitting cover positioned on said housing and adapted for having light beams emitted by said LED lighting assemblies pass therethrough during operation of said LED lamp; and
a connector for electrically connecting said circuits of each of said LED lighting assemblies to a power source for providing electrical power to said circuits so as to power each of said LED lighting assemblies.

12. The LED lamp of claim 11 wherein said plurality of LED lighting assemblies is spacedly positioned within said housing in a substantially annular pattern.

13. The LED lamp of claim 12 wherein the number of LED lighting assemblies is eight.

14. The LED lamp of claim 12 wherein each of said LED lighting assemblies includes seven LEDs.

15. The LED lamp of claim 12 further including a handle, said handle being secured to or forming part of said housing.

16. The LED lamp of claim 15 wherein said handle is substantially centrally positioned relative to said light-transmitting cover and said plurality of said LED lighting assemblies are positioned within said substantially annular pattern about said handle.

17. The LED lamp of claim 16 wherein each of said LED lighting assemblies provides a plurality of said light beams, said light beams of each of said LED lighting assemblies converging on a common focal location spaced from said LED lamp.

18. The LED lamp of claim 11 wherein each of said LED lighting assemblies further includes a plurality of simple lenses, each of said simple lenses being positioned adjacent a respective one of said LED's within said LED lighting assemblies for directing a light beam from said respective one of said LEDs in a predetermined direction.

19. The LED lamp of claim 11 wherein each of said circuits of each of said LED lighting assemblies includes at least two lines, each of said lines of each of said circuits being electrically coupled to a respective one of said conductive leads of said LEDs of said LED lighting assembly.

20. The LED lamp of claim 11 wherein the total light output of said LED lamp is about 160,000 lux.

* * * * *